United States Patent
Wilsher et al.

(10) Patent No.: US 6,985,219 B2
(45) Date of Patent: Jan. 10, 2006

(54) OPTICAL COUPLING FOR TESTING INTEGRATED CIRCUITS

(75) Inventors: Kenneth R. Wilsher, Palo Alto, CA (US); Steven A Kasapi, San Francisco, CA (US)

(73) Assignee: Credence Systems Corporation, Milpitas, CA (US)

( * ) Notice: Subject to any disclaimer, the term of this patent is extended or adjusted under 35 U.S.C. 154(b) by 583 days.

(21) Appl. No.: 09/746,618

(22) Filed: Dec. 21, 2000

(65) Prior Publication Data

US 2002/0113958 A1 Aug. 22, 2002

(51) Int. Cl.
*G01N 21/88* (2006.01)

(52) U.S. Cl. .................................. 356/237.1; 324/752
(58) Field of Classification Search ............. 356/237.1; 324/752, 753
See application file for complete search history.

(56) References Cited

U.S. PATENT DOCUMENTS

| | | | |
|---|---|---|---|
| 160,407 A | | 3/1875 | Eubank |
| 4,627,731 A | * | 12/1986 | Waters et al. ............... 356/479 |
| 5,152,962 A | * | 10/1992 | Lackie ....................... 356/317 |
| 5,631,571 A | | 5/1997 | Spaziani et al. ............ 324/752 |
| 5,751,159 A | | 5/1998 | Holm et al. ................. 324/767 |
| 5,812,708 A | * | 9/1998 | Rao ............................. 385/14 |
| 5,889,903 A | | 3/1999 | Rao ............................. 385/14 |
| 6,052,498 A | * | 4/2000 | Paniccia ...................... 385/14 |
| 6,160,407 A | | 12/2000 | Nikawa ...................... 324/750 |
| 6,501,288 B1 | * | 12/2002 | Wilsher ...................... 324/753 |

OTHER PUBLICATIONS

Valdmanis, J., Advanced Electro–Optic Sampling Permits Non–Invasive Testing of IC Performance, Electronic Engineering, Morgan–Grampian Ltd., London, GB, vol. 61, No. 756, pp. 35, 36, 40, 42 (Feb. 1, 1989).

* cited by examiner

*Primary Examiner*—Richard A. Rosenberger
(74) *Attorney, Agent, or Firm*—Dorsey & Whitney LLP

(57) ABSTRACT

A method and system of testing integrated circuits (IC) via optical coupling. The optical system includes an optical fiber, fixture and focussing element. In addition, channels are provided in the fixture mounted on the integrated circuit to accommodate the optical system. The fixture acts as a heat sink. As such, one or more photosensitive elements/targets on the integrated circuit are probed using light that is brought to a focus on each target site. The light causes latching of data into the integrated circuit (which is operating under influence of a test program) and formation of a test pattern output from the integrated circuit that is used to confirm proper functioning of the IC.

2 Claims, 6 Drawing Sheets

OPTICAL COUPLING FOR TESTING INTEGRATED CIRCUITS

FIELD OF THE INVENTION

The present disclosure generally relates to optical systems and methods of testing integrated circuits, and particularly to triggering or probing defined photosensitive targets on an integrated circuit using a light beam directed onto the targets.

BACKGROUND

An integrated circuit (IC) is an electronic circuit that is formed in or on a die, such as crystalline silicon, and is packaged as a discrete electrical component/unit.

Various methods of testing complex integrated circuits have been developed. A conventional method of testing integrated circuits involves sending a series of test vectors (electrical signals) to the input terminals of the device under test (DUT) and comparing its response (output signals) to a previously generated data set. For example, a typical integrated circuit tester, such as the Schlumberger model number ITS9000KX, sends a particular electrical digital test pattern to the DUT. The DUT responds to these incoming signals and sends output signals back to the tester. The tester then compares these output signals to the expected response, and a test failure is flagged if there is a mismatch.

As integrated circuits become more complex, the generation of a complete set of test vectors and responses utilizing the above-described test method has become almost impossible. One solution to this test problem involves the introduction of on-chip test methods, such as scan chains. A scan chain, or shift register, is an on-chip circuit used to input and capture test signals to and from the IC. In particular, the scan chain serially loads data to a section of the IC and sets the input nodes of this section to a known state. The responses or outputs from the section are later latched into the scan chain, further facilitating the testing process. As such, the static logic function of separate sections of the IC can be confirmed or tested in this manner.

Although scan chains have generally improved and facilitated IC testing at low speeds, scan chain capabilities may not be compatible with testing the full speed internal dynamic behavior of all ICs. For example, circuits including timing components, such as high frequency clock generators, will greatly complicate the accurate loading and latching of internal node data "on the fly" via the scan chain. Because of this, the on-chip time relationship between voltage transitions on two or more nodes may not be accurately represented from the data obtained using existing scan chain methods.

A proposal to solve this problem for integrated circuits and related devices is disclosed in co-pending U.S. patent application, entitled "On-Chip Optically Triggered Latch for IC Time Measurements," Kenneth R. Wilsher, filed Sep. 28, 2000, Ser. No. 09/675,090, (the subject matter of which is incorporated herein by reference). In that disclosure, it is shown that a light pulse can be used as a trigger pulse to an on-chip data latch. By design, selected nodes of the IC are connected to the data input terminals of the optically triggered latches. The light pulse provides a very accurate timing signal that can be directed to any light sensitive latch in any part of the IC. The latched state is then read out via a scan chain. Since the light pulse can be directed at light sensitive elements at separate locations on the IC, it is possible, by repeating the test, to obtain test data on these widely separate selected nodes with confidence that the recorded time relationships are a very accurate representation of the actual on-chip electrical activity. Therefore, accurate clock path and logic path timing measurements can be made using this test method.

The optical system to deliver the light pulse as described above is a laser scanning microscope (LSM). An example of such a microscope is the LSM supplied by Checkpoint Technologies. FIG. 1 illustrates a cross-sectional side view of relevant portions of an exemplary optical system 10 and DUT 12. The DUT 12 includes a semiconductor device 14 that is electrically and mechanically coupled to a multilayer substrate 16 by ball-bonds 18. Electrical signal and power connections are made between multilayer substrate 16 and the test system multi-layer printed circuit board 15 via compliant connections 17. The device 14 includes a semiconductor substrate 20 (or die) having one or more circuit elements (or targets 22) formed within the substrate 20. In general, the optical system 10 consists of a microscope 24 having one or more lenses 26 used to focus a beam of light 28 onto the light sensitive element/target 22.

In order to be able to observe the various targets 22 of the integrated circuit and direct the light pulse 28 to the various light sensitive elements 22 on the die, the original cover plate or heat sink of the DUT 12 must be removed, as it would completely block the optical beam. Some heat sinking however may still be necessary because the DUT 12, which is operating during the testing, otherwise could overheat.

An alternative heat sinking arrangement 30 can be provided whereby a heat sink is prepared so as to expose only sections of the backside of the semiconductor substrate 20 above the locations of the light sensitive targets. Preferably, the exposed substrate 20 of the DUT 12 is polished and anti-reflection coated.

During use, a light beam or pulse 28 passes through one or more lenses 26, into the silicon substrate 20, and is brought into focus at the target 22. The target 22 is generally a diffusion region that has very small extension, typically less than a micrometer, in the vertical direction. To obtain good resolution, the lens 26 has high numerical aperture and is positioned very near the surface of the silicon substrate 20 and, thereby, the target 22, leaving room only for a thin heat sink 30. As such, this arrangement allows optical probing of the light sensitive elements 22 of the DUT 12 by focussing the light pulse through holes located in the modified heat sink structure 30 corresponding to specific test sites on the die.

The above-described method of using a light pulse to test integrated circuits offers many advantages over current methods, including improved ease of operation and timing accuracy. However, since microscope 24 can only direct the beam to one light sensitive element at a time, it would be useful to have a low cost system and/or method whereby different targets on the DUT can be probed simultaneously or in rapid succession without requiring re-alignment of the microscope. It would also be useful to have an optical test system and method that allows the DUT to be probed with a good heat sink attached. Elimination of the LSM and complex heat sinking would allow optical probing while the DUT is operating in its normal system environment, such as a computer board, rather than in a special test arrangement.

SUMMARY

In view of the foregoing, embodiments of the present method and apparatus provide a test system whereby various targets on a device under test (DUT) can be individually probed. Embodiments provide a test system whereby various targets on a DUT can be probed simultaneously or in rapid succession without requiring re-alignment of a microscope.

These and other advantages not specifically enumerated herein are believed to be addressed by the presently disclosed method and apparatus that contemplate an optical test system for testing integrated circuits. The optical test system includes an optical fiber, mechanical alignment test fixture and a focussing element. The optical fiber of the test system is optically connected at its proximal end to a light source. The fiber is adapted to extend through a hole defined in the alignment fixture, thereby being brought into approximate alignment with one or more of the light sensitive targets on the integrated circuit. The focussing element, such as a computer generated holographic optical element (CG-HOE), zone plate or lens located near the DUT and the distal end of the fiber, is configured to focus the beam of light emerging from the fiber onto the photosensitive element or elements of the integrated circuit.

There is also contemplated an optical test system including an optical fiber, alignment fixture and focusing element, whereby the focussing element is a combination of optical elements. In particular, the combination of optical elements includes one or more lenses and a zone plate, one or more lenses and a CG-HOE, or two or more lenses. The optical elements may be formed in the DUT or separate from the DUT, but in alignment with the photosensitive elements.

There is further contemplated a method of testing an integrated circuit on a device under test by inserting an optical fiber into a fiber alignment hole located in a heat sink of the DUT. Light from a light source is applied to the proximal end of the fiber. As the light exits the distal end of the fiber, a focussing element collimates the light which is then brought to focus on the photosensitive target of the integrated circuit. Data is latched into the DUT and a test pattern is formed, wherein the test pattern may be used to confirm proper functioning of the IC.

There is also contemplated an electrical article of manufacture including a semiconductor substrate having a proximal surface and a distal surface. One or more interconnecting contacts and associated photosensitive elements are located on the distal surface of the substrate. In addition, one or more optical focussing elements are in contact with the proximal surface of the substrate and in alignment with the photosensitive elements. To dissipate heat generated during use or testing of the article or device, a heat sink can be in contact with the proximal surface.

The optical system, referenced above, can be solid optics, zone plates, diffractive optical elements, general computer-generated holograms or combinations thereof.

BRIEF DESCRIPTION OF THE DRAWINGS

The features of the described embodiments are specifically set forth in the appended claims. However, embodiments relating to both structure and method of operation are best understood by referring to the following description and accompanying drawings (not drawn to scale), in which similar parts are identified by like reference numerals.

DETAILED DESCRIPTION

Figure 2A:
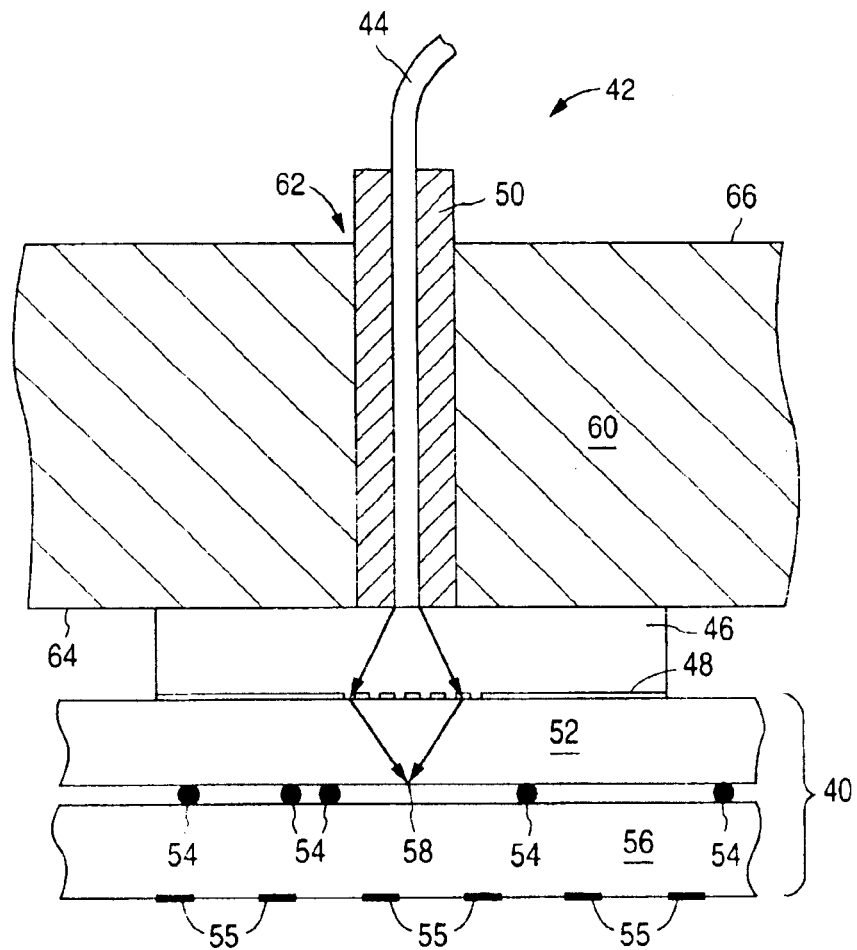
FIG. 2a is a cross sectional view of an embodiment of a DUT and optical system in accordance with the present disclosure.

FIG. 2a shows a cross-sectional view of part of a DUT 40 and an optical system 42 in accordance with one embodiment of this disclosure. The optical system 42 includes an optical fiber 44, a transparent substrate 46, a focussing element 48, and a tube or ferrule 50, which holds the distal end of the fiber 44 securely and facilitates insertion of the fiber 44 in the alignment fixture 60. In addition, alignment fixture 60 includes one or more holes 62 that correspond to and are in alignment with the target site(s) 58 in the DUT 40 (explained in further detail below). Tube 50 containing fiber 44 is a precise fit in hole 62 in fixture 60. The focussing element 48 is located near the distal end of the fiber 44 and a light source (not shown) is located near the proximal end of the fiber 44. An approximate outside diameter of the tube is 0.5 to 2.0 mm.

In general, the optical fiber 44 is a conventional transparent material such as glass, fused silica or plastic. The fiber 44 is used as a conduit to transmit light from the associated light source (not shown) to the focussing element 48. The light source may be, but is not limited to, a continuous laser beam or a pulsed laser beam.

The DUT 40 conventionally includes an integrated circuit die and one or more electrical interconnecting metal contact layers. In particular, the DUT 40 includes a die 52, made of silicon or other semiconductor material, a metal interconnecting layer, ball bonds or other interconnecting contacts 54 formed on package 56, metal contact pads 55, and target 58 (compliant interconnects and printed circuit board not shown—but are required for operation of the IC). Although only one target 58 is shown, the DUT 40 generally includes one or more targets 58. The targets 58 each correspond to a light sensitive element coupled to the various electrical junctions or nodes to be tested on the integrated circuit of the DUT 40. Further detail regarding the DUT 40 can be found in co-pending U.S. patent application, filed Sep. 28, 2000, Ser. No. 09/675,090, entitled "On-Chip Optically Triggered Latch for IC Time Measurements," Kenneth R. Wilsher, (the subject matter of which is incorporated herein by reference).

The light sensitive element or target 58 of the present disclosure may be a diode (not shown) that is electrically coupled to the input terminal of a Schmitt trigger (not shown). The output terminal of the trigger is coupled to the clock input terminal of a "D" flip-flop or similar latching device. The "D" flip-flop or other data latching device also receives at its D-input (or data) terminal an input signal from a logic circuit (node) of conventional IC circuitry (not shown). The Q-output terminal of the "D" flip-flop is coupled to an output device, such as a scan chain.

The alignment fixture 60 associated with the DUT 40 can also perform the function of a good heat sink. As such, the alignment fixture 60 may be fabricated from aluminum, copper or other composites having high thermal conductivity. Heat generated in substrate 52 must be conducted through transparent substrate 46 before reaching fixture/heat sink 60. Therefore, a high heat conductivity material, for example sapphire or diamond, is recommended for substrate 46. However, the fixture 60 of the present device also defines one or more through-holes or channels 62 that extend from the distal surface 64 to the proximal surface 66 of the heat sink 60. In one embodiment, the heat sink 60 is manufactured with one or more holes 62 to accommodate the present test device. Each hole 62 functions as a fiber alignment guide into which the tube 50 of the optical system 42 is inserted. The location of each hole 62 corresponds to the general position of the target 58, as will be described further below.

In one embodiment, the focussing element 48 is a zone or phase plate structure. A zone plate consists of an essentially planar optical layer with opaque and transparent regions, such that only parts of an incident optical wavefront are transmitted through it. A phase plate consists of an essentially planar optical layer with regions that phase retard the passage of an optical beam wavefront more than the other regions. Zone plates or phase plates 48 can be produced by scribing techniques, which are well known to those skilled in the art. However, the zone plates or phase plates 48 may also be fabricated from generalized computer-generated holographic optical elements (CG-HOEs), also known as diffractive optical elements (DOEs). One advantage of CG-HOEs as light delivery devices is that the CG-HOE 48, together with the diamond heat sink/substrate 46, can focus the light to one arbitrary spot or multiple spots on the DUT 40. Several target sites 58 can thus be simultaneously stimulated by a single laser beam or pulse, assuming that sufficient power is delivered to trigger all the target devices. It should be noted that correct functioning of the CG-HOEs requires that the fiber optic cable 44 used to deliver the light beam be single mode.

Zone or phase plate fabrication can be generalized by using computer-generated holographic optical elements to focus light in a nearly arbitrary pattern on the DUT 40. Production of the diffractive optic typically involves producing a master hologram (not shown) which is used to mass-produce subsequent holograms.

The computer-generated hologram is formed by computing the diffraction or interference pattern that would be formed by the single mode optical fiber 44 output beam (including collimation, if provided) and a point light source located at the target site 58. The pattern is first computed for a single target site, as is well known by those skilled in the art. As such, for each required target spot the diffraction pattern is computed. The amplitudes of the individual diffraction patterns are added together to build up a diffraction pattern encoding all the target spots. Once the full pattern has been computed, each of the amplitudes is squared to form an interference pattern and a discreet thresholding technique, also well known to those skilled in the art, is then applied. For one embodiment, the hologram masks are produced using electron-beam mask writing techniques onto a suitable resist which can then be etched to produce a pattern in an optically opaque material, such as chromium metal. Alternatively, direct silicon etching could also be used to be compatible with modern integrated circuit manufacturing techniques.

Direct etching techniques involve writing the hologram directly onto a substrate using an electron beam (e-beam) or a laser beam on a photoresist. However, direct e-beam writing may be time consuming, especially if the holograms are to be produced in large quantities. As an alternative, a mask can be written and then used to produce multiple HOE's. The mask pattern is written on a substrate using an electron beam to produce a master mask set. The mask set can either be binary in nature or gray scale. The master mask set can then be used to produce holograms in polymer material. Once the pattern is written the photoresist is developed. The developed pattern is then used as a master to produce multiple copies of the computer generated hologram in a polymer or plastic substrate, which can be bonded to the surface of the silicon.

Figure 2B:
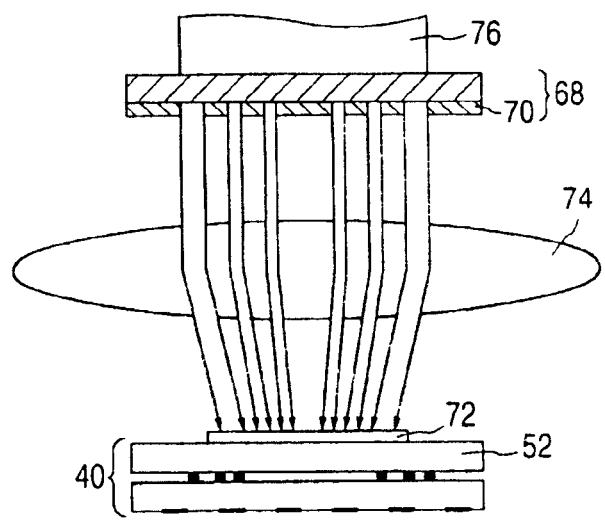
FIG. 2b is a perspective view of a test fixture and optical system in accordance with the present disclosure.

In an alternate embodiment, shown in FIG. 2b, the hologram is etched directly into the silicon substrate 52 of the DUT 40. Once the mask 68 is produced by e-beam writing or other well-known techniques, the hologram pattern 70 can be transferred to the substrate 52 of the DUT 40 using standard silicon etching techniques. Silicon etching techniques, which are well known to those skilled in the art, involve spinning resist 72 onto the thinned and polished DUT 40. A lens system 74 is used to focus the pattern onto the resist 72. The photoresist 72 is exposed to ultraviolet (UV) light 76 and developed accordingly. Portions of the material 52 are etched away to form a hologram 70 and the remaining resist 72 is removed. The resulting etched pattern (an example of which is shown in FIG. 4b), forms the desired image points when illuminated by the beam from a single mode optical fiber 44 (not shown) either directly or after the beam divergent from the fiber has been collimated.

Referring back to FIG. 2a, one embodiment of the HOE 48 in a HOE substrate 46 placed in contact with the DUT substrate 52 is shown. The silicon substrate 52 is thinned and polished to make good contact with the HOE substrate 46 that, in general, may be made out of materials having high optical transmission and good thermal conductivity, such as diamond or sapphire. An optical system 42 delivers independently controlled single-mode beams of light. The light is sent into the system 42 through the optical fiber 44. The light passes through the fiber 44 and exits into the HOE substrate 46. As shown in FIG. 2a, the light beam expands as it passes through the HOE 46. The CG-HOE/zone plate 48 patterned on a surface of the HOE substrate 46 diffracts the light from the fiber 44 to focus it onto the target site 58 in the DUT 40.

Although the CG-HOE/zone plate pattern and substrate 46 are assembled on the die 52, the CG-HOE/zone plate pattern does not substantially prevent the transfer of heat from the die 52 to the fixture 60 because it is only on the order of micrometers in thickness and, thus, has very low thermal resistance. By selecting an appropriate material, for example copper or aluminum, the overall structure and function of the fixture 60 can provide sufficient heat dissipation during testing of the DUT 62, even when the fixture 60 includes multiple fiber-alignment holes 62.

Figure 1:
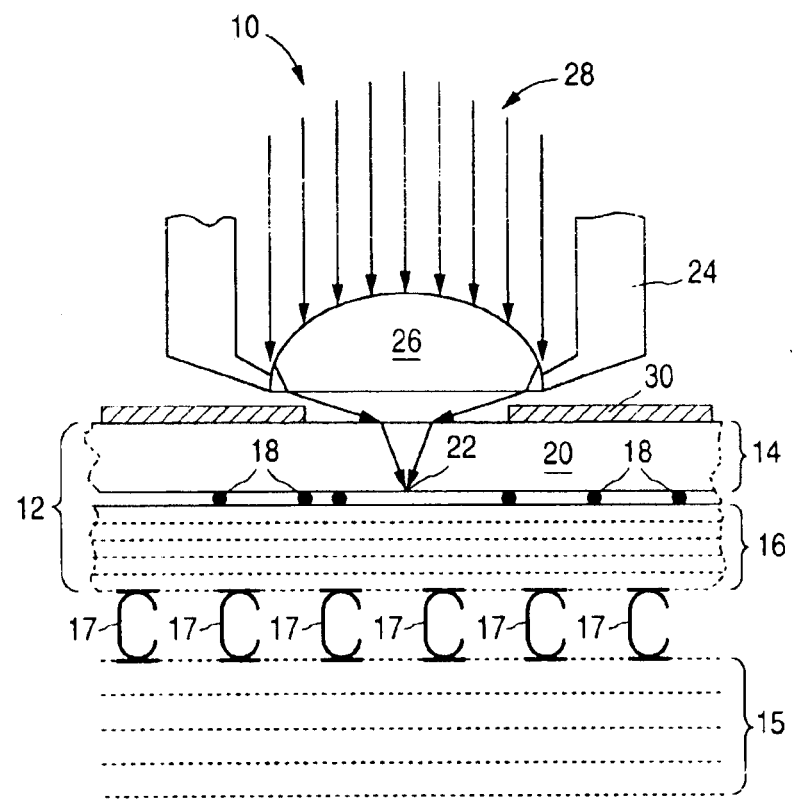
FIG. 1 is a cross-sectional view of an exemplary optical system and DUT having an alternative heat sinking arrangement.
Figure 3:
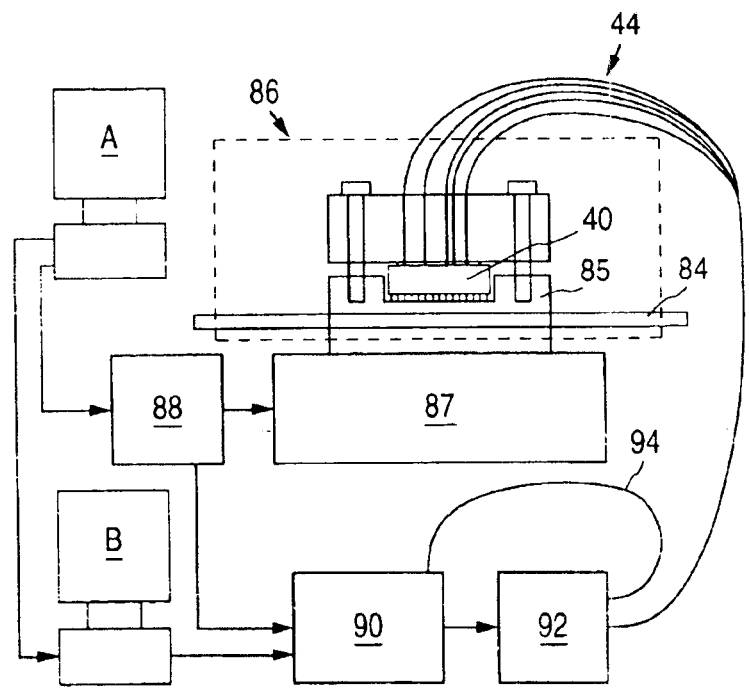
FIG. 3 is a perspective view of a test system in accordance with the present disclosure.

FIG. 3 illustrates an overall embodiment of the present test device and method. DUT 40, with correctly aligned HOE substrate 46 attached (not shown), held in socket 85 of test fixture 86. Alignment fixture 60 containing holes 62 is assembled with DUT 40. In general, the DUT 40 is stimulated by a test sequence determined by the data contained in the system memory under the control of workstation (computer) A. Workstation A sends commands to the test sequence generator 88. Generator 88 outputs signals to test head 87 which provides correct time and amplitude signals to DUT 40 via load board 84 on which the DUT socket 85 is mounted. A delay generator in electronic system 90 is set up by workstation B, and the delay is triggered by an output or trigger from the test sequence generator 88. The delay generator output then in turn triggers the laser 92 which provides a light pulse or pulses via one or more of the optical fibers 44 inserted into holes 62 in alignment fixture 60, so that these pulses activate the light sensitive elements in the DUT 40. One optical fiber 94 from the one or more fibers 44 previously described is brought back to electronic apparatus 90 so that jitter or variation in time between the delay generator output and the laser pulse is measured, thus allowing this error to be accounted for and essentially eliminated in the final measurement. The light pulse latches the state of some of the internal nodes of DUT 40 into internal latches. The state of these internal latches can be read via a scan chain by workstation A. Logic waveforms of the laser pulse latched nodes may be reconstructed and displayed by either workstation A or workstation B by repeating the test sequence using the various delay settings. Further information concerning the test fixture 86 and peripheral components can be found in co-pending U.S. patent application, filed Sep. 28, 2000, Ser. No. 09/675,090, entitled "On-Chip Optically Triggered Latch for IC Time Measurements," Kenneth R. Wilsher (the subject matter of which is incorporated herein by reference).

Unlike conventional test systems, the structural and functional features of the optical system 42 allow various configurations to be used with the device of the present invention. For example, the relatively thick fixture 60 shown in FIG. 2a (not drawn to scale) illustrates that the structural features of the fixture 60 are relatively unconstrained by optical considerations, thereby allowing the use of fixture 60 as an effective heat sink.

The CG-HOEs/zone plate structures 48 can be formed in situ on the surface of the silicon 52 or on a thin substrate almost exactly over the targets 58. This is easily accomplished since the position of all target sites 58 can be found from examination of the layout files of the DUT 40.

During manufacture of the DUT 40, each CG-HOE/zone plate 48 may either be formed as part of the die 52 of the DUT 40 or attached to the die 52 as a separate component as previously described. The zone plates 48 are positioned in alignment with the targets 58 of the DUT 40. Alternatively, a conventional DUT 40 may be modified to include one or more CG-HOEs/zone plates 48, as previously described. In particular, the heat sink of the DUT 40 may be removed and modified to include one or more fiber-alignment holes 62. In addition, one or more CG-HOEs/zone plates 48 can be added onto the die 52 utilizing the manufacturing techniques described above. The heat sink is then replaced onto the die 52 such that the holes 62 of the heat sink are in alignment with the CG-HOE/zone plates 48 and targets 58 of the DUT 40. It is to be understood that such a DUT may be a standard production IC modified by suitable processing for test purposes. Alternatively, the CG-HOEs/zone plates and associated fiber alignment fixturing may be provided on all standard production ICs where only certain ones are subject to the actual testing described here.

The optical arrangement shown in FIG. 2a illustrates one embodiment of a single HOE 48 focusing light from fiber 44 onto light sensitive element 58. In this arrangement, the exact position of the end of the fiber 44 in fixture 60 will determine, to a great extent, the position of the beam focus. Much greater tolerance on the positioning of the fiber would be achieved if the light emanating from the fiber were first accurately collimated.

Figure 4A:
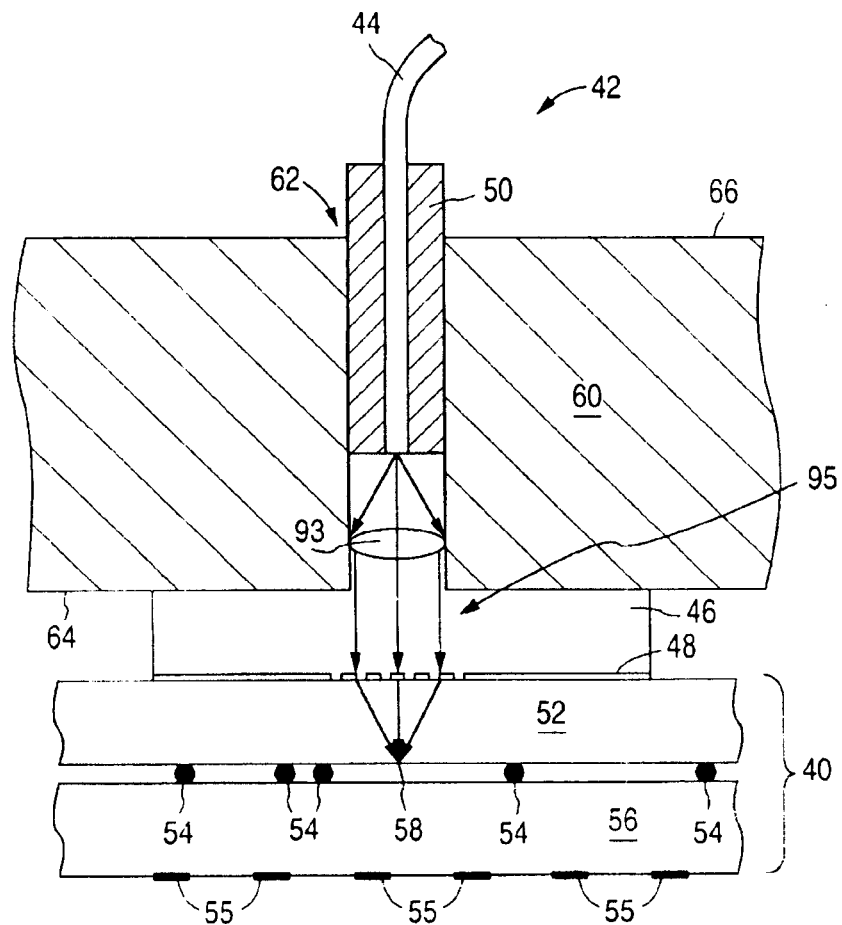
FIG. 4a is a cross sectional view of an alternate embodiment of a DUT and optical system in accordance with the present disclosure.
Figure 4B:
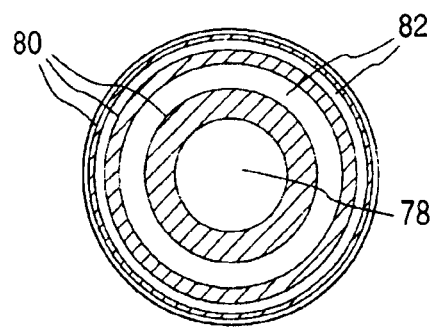
FIG. 4b is a top view of a zone plate in accordance with the present disclosure.

An alternative embodiment of the optical arrangement is shown in FIG. 4a. This shows a lens or HOE 93 attached to the fiber alignment tube 50. The positioning of the fiber end and lens or HOE 93 in the tube 50 is carefully adjusted so as to produce an accurately collimated beam before the fiber 44 and tube 50 assembly is inserted into the fixture 60. The light beam exiting fiber 44 is formed into a parallel beam 95 by lens or HOE 93. As is well known from simple lens theory, it is apparent that a small lateral displacement of the alignment hole 62 in fixture 60 will have essentially no effect on the position of the beam focus. Similarly, vertical displacement of the fiber/tube assembly in hole 62 will have essentially no effect on the vertical position of the beam focus.

In one embodiment of the invention using zone plates, the quantity and dimensions of the rings 82,80 of the zone plate 48, as shown in FIG. 4b, vary based upon the thickness of the die 52, since the die 52 determines the focussing distance. In general, ring dimensions and quantity are calculated based upon the particular die 52. For a zone plate, the dimensions are arranged so that the light from all transparent areas 82 of the zone plate 48 arrives in phase at the target, thereby forming a focus at a point under the center of the zone pattern at some distance or depth into the die 52.

Figure 4C:
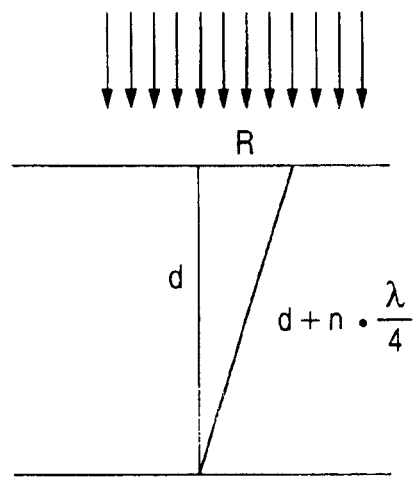
FIG. 4c is an illustration of a zone plate ring calculation.

For example, assume that the die 52 of the DUT 40 is made of silicon, having a coefficient of refraction of 3.5, and the light is a collimated laser light pulse, having a wavelength of 1.064 μm in air and, therefore, 0.304 μm in silicon. Further, assume that the die is 400 μm thick and the zone plate 48 configured to focus the light at the distal surface of the die 52. As shown in FIG. 4c, the zone edges will be the radius R where the light propagation length is changed from the direct path d by a half-period zone or half-wavelength, such as $\frac{1}{4}\lambda$, $\frac{3}{4}\lambda$, $\frac{5}{4}\lambda$, ... $n\lambda/4$. As such, an expression for R can be found utilizing the Pythagorean theorem whereby:

$$n=1,3,\ldots 15;\ \lambda=0.305;\ d=400$$

$$R_n=\sqrt{(d+n\lambda/4)^2-d^2}$$

The results are as follows:

| n  | $R_2$  |
|----|--------|
| 1  | 7.811  |
| 3  | 13.53  |
| 5  | 17.468 |
| 7  | 20.671 |
| 9  | 23.441 |
| 11 | 25.917 |
| 13 | 28.178 |
| 15 | 30.271 |

The results show the radius R in μm, wherein $R_1$ is the radius of the inner clear area, $R_2$ is the outside radius of the first opaque area, $R_3$ is the outer radius of the second clear area, etc.

Figure 5:
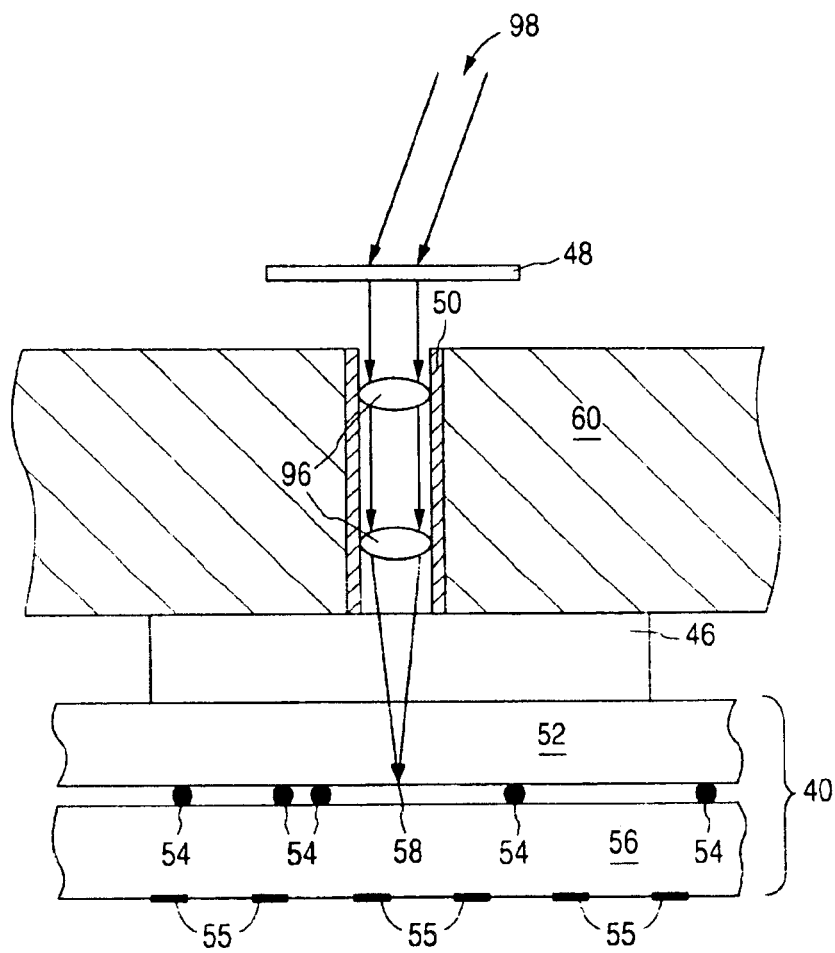
FIG. 5 is cross sectional view of another embodiment of a DUT and optical system in accordance with the present disclosure.

As explained above, the CG-HOE/zone plates 48 diffract light, causing the light to travel through the die 52 and come to a focus on the light sensitive elements 58. The absorption of light generates a current in the light sensitive elements 58 that subsequently produces output signals (data) associated with the particular circuit or the DUT under test. Alternative embodiments of the focussing element (CG-HOE/zone plate) 48 may also be used. For example, as shown in FIG. 5, a single CG-HOE 48 and one or more lenses 96 are used to focus the diffracted light onto the DUT 40. A collimated laser beam 98 is incident on the CG-HOE 48. The CG-HOE 48 is designed so that the CG-HOE 48 produces a first-order diffracted beam which the lens or lenses 96 transform into a series of spots that correspond to the target sites 58 on the diffusion layer of the DUT 40. By tilting the CG-HOE 48 it is possible to produce different diffraction patters and thus different spot patterns on the DUT 40. Different spot patterns can be encoded in the CG-HOE 48 by tilting the CG-HOE 48 with respect to the input laser beam 98.

Although the CG-HOE 48 is positioned before the lens (es) 96 in FIG. 5, the CG-HOE 48 can also be positioned after the lens(es) 96. Further, light from an optical fiber can also be used in place of the collimated beam of laser light 98. As such, the characteristics of the optical elements are modified to accommodate the particular configuration of the elements.

Figure 6:
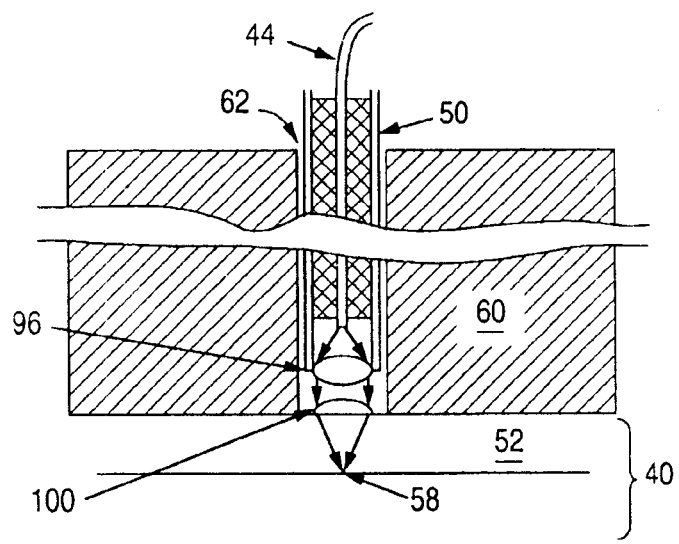
FIG. 6 is a cross sectional view of another embodiment of a DUT and optical system in accordance with the present disclosure.

In another embodiment, shown in FIG. 6, an additional lens 100 is utilized as a focussing element in place of the CG-HOE/zone plate structure. Specifically, a small lens 100, preferably made of silicon, is attached to the die 52 of the DUT 40. An example of such a lens 68 is an immersion lens. An immersion lens is a lens having a similar index of refraction as the optical element to which it is optically coupled. This particular lens type increases optical efficiency (numerical aperture) and permits better image quality. Although a silicon immersion lens has been disclosed here, it should be understood that a variety of similar lens types and elements, such as an immersion zone plate, can also be used with the present invention.

For the present device in one embodiment, the immersion lens 100 has the same index of refraction as the die 52 of the DUT 40. As such, the immersion lens 100 is attached to the die 52 of the DUT 40 with a thin layer of optical adhesive (not shown). The lens 100 is accurately positioned over the light sensitive element 58 of the DUT 40 to optimize performance. As with the previous embodiment, the heat sink 60 is attached to the die 52 so that the fiber alignment holes 62 of the heat sink 60 are aligned with each immersion lens 100 and light sensitive element 58 of the DUT 40. In order to test the DUT 40, a ferrule 50 containing a fiber 44 and collimating lens 96, as previously described, is inserted into each of the holes 62 and light is pulsed through the system. The light probes the various target sites on the DUT 40 to test circuit function and performance characteristics.

Figure 7:
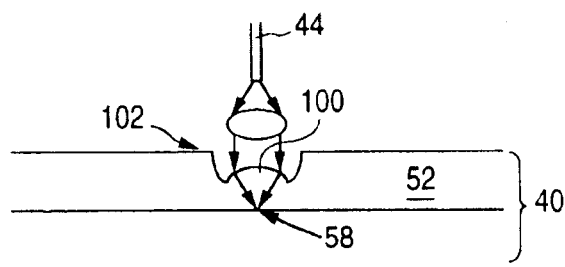
FIG. 7 is a partial cross sectional view of another embodiment of a DUT and optical system in accordance with the present disclosure.

In yet another embodiment, the immersion lens 100 is configured as part of the die 52. As shown in FIG. 7, the immersion lens 100 is formed on the proximal portion 102 of the die 52. Grinding, etching and/or polishing, or other similar processes, may be used to form and finish the lens 100 in the die 52. The process of grinding the lens 100 out of the die material of the DUT 40 not only minimizes the potential of undesirable scattered light due to material variability, but also renders the optical characteristics of the lens 100 sufficient for its intended application. In addition, the resulting recessed lens 100 is protected by the surrounding die 52 material from damage during manufacture or assembly of the finished DUT 40.

Figure 8:
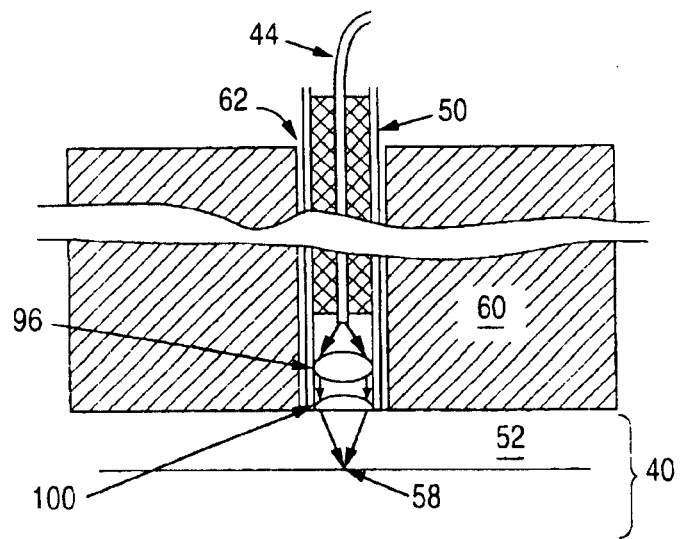
FIG. 8 is a cross sectional view of another embodiment of a DUT and optical system in accordance with the present disclosure

In a further embodiment, shown in FIG. 8, the immersion lens 100 is attached to the distal end of the ferrule 50 that houses the optical fiber 44. A drop of high refractive index oil (not shown) resides on the proximal surface of the silicon die 52. Preferably, the index of refraction of the oil is close to the index of refraction of silicon. The immersion lens 100 is immersed into the drop of oil so that the majority of the oil is excluded from the lens 100-silicon 52 interface. Therefore, when light is pulsed through the test system, this particular system configuration produces increases optical efficiency and yields improved optical resolution.

Although the majority of light is most likely absorbed by the DUT 40, it should be noted that some of the light will be reflected by the target 58 and return along the incident beam path. In particular, the reflected light will be re-focussed by the lens back into the fiber 44 and exit the proximal end of the optical fiber 44. This reflected light can then be collected by a suitable apparatus (photodetector) for further analysis. For example, the intensity of the reflected light could be compared against previously found values so as to check that the focusing of the light on the target was correct. In addition, the reflected light could also be used to determine whether the laser light source was correctly coupled into the fiber. Additional analyses, although not mentioned herein, may also be performed.

As has already been described, the CG-HOE/zone plate allows a single input light beam to be focussed to a variety of locations or split into several spots. The distal end of the ferrule 50 and heat sink 60 will be in close contact with substrate 46. The surface of the ferrule 50 and heat sink 60 are very flat and well polished to allow good optical contact with substrate 46. An optical bonding material or index-matching oil may also be used to reduce the effect of the interface.

Figure 9A:
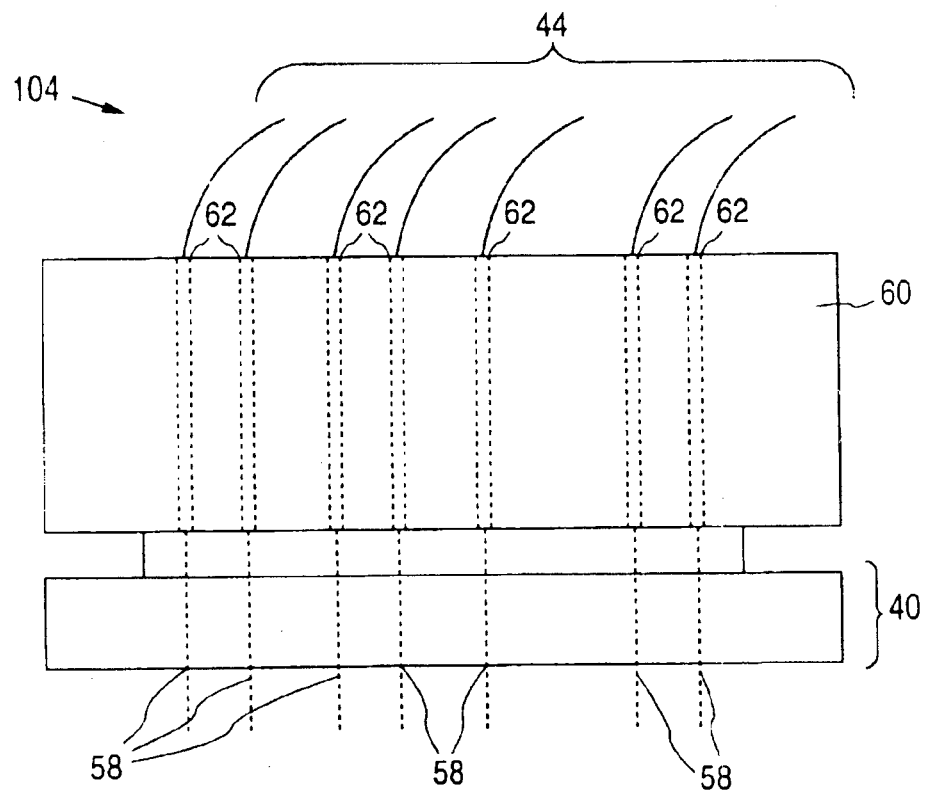
FIG. 9a is a cross-sectional view of a DUT and optical system in accordance with the present disclosure.
Figure 9B:
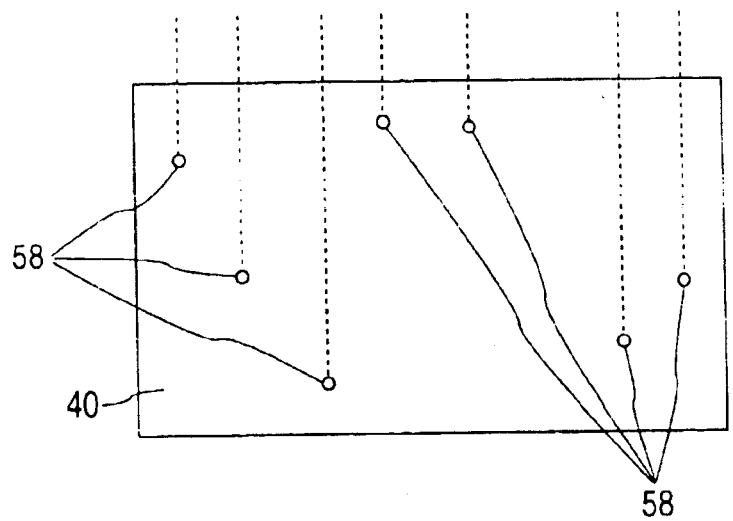
FIG. 9b is a top view of a DUT in accordance with the present disclosure.

FIGS. 9a and 9b illustrate an embodiment of a multi-fiber optical test system 104 and DUT 40 having a plurality of light sensitive targets 58. In particular, FIG. 9b shows in a plan view the target sites 58 positioned on the surface of the die of the DUT 40. For this configuration, multiple optical trigger signals are sent via a plurality of fibers 44 to multiple locations on a die. The multi-fiber optical test system includes one or more optical fibers that are connected at their proximal ends to a light source, such as an optical pulse sub-system (not shown). Each individual optical system for this embodiment may be any one, or a combination, of the optical systems previously described. Therefore, as shown in FIG. 9a, each optical system is inserted into each fiber alignment hole 62 located in the heat sink structure 60 of the DUT 40. The optical systems may be triggered simultaneously, in sections or individually, depending on test format and procedure. As described above, light propagates through each optical system and is brought to a focus at the targeted light sensitive elements 58 in the DUT 40. The light pulse causes latching of data into the DUT 40 and formation of a test pattern that is used to confirm proper functioning of the IC.

Although the present method and apparatus has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. A method of testing a device under test having an operating integrated circuit on a fixture comprising the acts of:

inserting an optical fiber into a hole defined in said fixture;

applying light from a light source to a proximal end of said fiber;

focusing said light as it exits a distal end of said fiber onto a photosensitive element of said integrated circuit thereby to cause latching of data into said integrated circuit;

capturing light at a proximal end of said fiber reflected by said element; and analyzing said reflected light for proper focusing of said light onto said element.

2. A method of testing a device under test having an operating integrated circuit on a fixture comprising the acts of:

inserting an optical fiber into a hole defined in said fixture;

applying light from a light source to a proximal end of said fiber;

focusing said light as it exits a distal end of said fiber onto a photosensitive element of said integrated circuit thereby to cause latching of data into said integrated circuit;

capturing light at a proximal end of said fiber reflected by said element; and analyzing said reflected light to determine whether said light is correctly coupled into said fiber.

\* \* \* \* \*